(12) United States Patent
Cadee et al.

(10) Patent No.: US 9,195,150 B2
(45) Date of Patent: Nov. 24, 2015

(54) LITHOGRAPHIC APPARATUS COMPRISING A SUPPORT FOR HOLDING AN OBJECT, AND A SUPPORT FOR USE THEREIN

(71) Applicant: ASML Netherlands B.V., Veldhoven (NL)

(72) Inventors: Theodorus Petrus Maria Cadee, Asten (NL); Vadim Yevgenyevich Banine, Deurne (NL); Koen Jacobus Johannes Maria Zaal, Eindhoven (NL); Ramin Badie, Eindhoven (NL); Harmeet Singh, Fremont, CA (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 14/377,141

(22) PCT Filed: Feb. 4, 2013

(86) PCT No.: PCT/EP2013/052154
§ 371 (c)(1),
(2) Date: Aug. 6, 2014

(87) PCT Pub. No.: WO2013/117518
PCT Pub. Date: Aug. 15, 2013

(65) Prior Publication Data
US 2015/0002832 A1    Jan. 1, 2015

Related U.S. Application Data

(60) Provisional application No. 61/595,362, filed on Feb. 6, 2012.

(51) Int. Cl.
G03B 27/58    (2006.01)
G03F 7/20    (2006.01)
H01L 21/687    (2006.01)

(52) U.S. Cl.
CPC ........ *G03F 7/70725* (2013.01); *G03F 7/70708* (2013.01); *G03F 7/70733* (2013.01); *H01L 21/6875* (2013.01)

(58) Field of Classification Search
CPC .................. G03F 7/70725; G03F 7/70733
USPC .............. 355/72–76; 361/234; 378/34, 35
See application file for complete search history.

(56) References Cited

U.S. PATENT DOCUMENTS 5,563,684 A     10/1996  Stagaman
6,084,938 A *   7/2000   Hara et al. ............. 378/34

(Continued)

FOREIGN PATENT DOCUMENTS

WO    WO 01/90820 A1    11/2001

OTHER PUBLICATIONS

International Search Report directed to related International Patent Application No. PCT/EP2013/052154, mailed Nov. 8, 2013; 4 pages.
International Preliminary Report on Patentability and Written Opinion of the International Searching Authority direted to related International Patent Application No. PCT/EP2013/052154, issued Aug. 12, 2014; 6 pages.

*Primary Examiner* — Hung Henry Nguyen
(74) *Attorney, Agent, or Firm* — Sterne, Kessler, Goldstein & Fox, P.L.L.C.

(57) ABSTRACT

A lithographic apparatus has a support that is provided with burls for holding an object. The support has been fabricated with a lithographic manufacturing method, e.g., a MEMS-technology, so as to create burls whose orientations or positions are individually electrically controllable.

13 Claims, 3 Drawing Sheets

(56) References Cited

U.S. PATENT DOCUMENTS

| | | | |
|---|---|---|---|
| 6,875,987 B2 * | 4/2005 | Kondo | 250/442.11 |
| 2005/0030512 A1 * | 2/2005 | Maria Zaal et al. | 355/75 |
| 2008/0090427 A1 * | 4/2008 | Humpston et al. | 439/66 |
| 2008/0291411 A1 | 11/2008 | Phillips | |

* cited by examiner

LITHOGRAPHIC APPARATUS COMPRISING A SUPPORT FOR HOLDING AN OBJECT, AND A SUPPORT FOR USE THEREIN

CROSS-REFERENCE TO RELATED APPLICATIONS

This application claims the benefit of U.S. provisional application 61/595,362 which was filed on Feb. 6, 2012, and which is incorporated herein in its entirety by reference.

BACKGROUND

1. Field of the Invention

The present invention relates to a lithographic apparatus comprising a support for holding an object, and to a support configured for use in a lithographic apparatus.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

The lithographic apparatus may have a support for supporting an object such as a substrate or a mask with a tight flatness requirement. Temperature changes, deformation of the object, contamination of the support and/or the object, wear of the support may have a detrimental effect on the flatness requirements.

SUMMARY

It is desirable to provide a support for an object in a lithographic apparatus which supports the object with sufficient flatness.

An embodiment of the invention relates to a lithographic apparatus that comprises a support for holding an object. The support has a first part with a first upper main surface facing the object when the support is holding the object. The support has a second part with a second upper main surface facing a first bottom main surface of the first part. The second upper main surface and the first bottom main surface are spaced apart from each other by means of multiple discrete support walls. The support has a plurality of burls extending from the first upper main surface. A first one of the plurality of burls has a first top surface operative to contact the object when the support is holding the object. A second one of the plurality of burls has a second top surface operative to contact the object when the support is holding the object. The first top surface has a first position relative to the second upper main surface and has a first orientation relative to the second main surface. The second top surface has a second position relative to the second upper main surface and has a second orientation relative to the second upper main surface. The lithographic apparatus comprises a controller that is configured for at least one of controlling the first position and the second position independently of one another when the support is holding the object; and controlling the first orientation and the second orientation independently of one another when the support is holding the object.

In a further embodiment, the first lower main surface accommodates a first electrode underneath the first burl and the second upper main surface accommodates a second electrode facing the first electrode. The controller is operative to control at least one of the first position and the first orientation via controlling a capacitive force between the first electrode and the second electrode.

In a further embodiment, the second electrode comprises multiple electrically isolated portions, and the controller is operative to control at least one of the first position and the first orientation via controlling a respective component of the capacitive force between a respective one of the multiple electrically isolated portions and the first electrode.

In a further embodiment, the first part accommodates a sensor configured for sensing at least one of a first change in the first position and a second change in the first orientation and for providing a sensor output signal representative of at least one of the first change and the second change. The controller is operative to control at least one of the first position and the first orientation in dependence on the sensor output signal.

In a further embodiment, the second upper main surface accommodates a stop configured for limiting at least one of a first change in the first position and a second change in the second position.

In a further embodiment, the first upper main surface accommodates at least one of a heater operative to locally generate heat, and a temperature sensor operative to sense a local temperature of at least one of the support and the object.

In a further embodiment, the support is manufactured with a lithographic manufacturing method.

The invention also relates to a support configured for use in the lithographic apparatus specified above. The support may have been manufactured with a lithographic manufacturing method. An example of a suitable lithographic manufacturing technology is a technology employed for manufacturing integrated electronic circuitry, i.e., a semiconductor device fabrication technology. It is remarked here that such lithographic manufacturing technology is being used to manufacture microelectromechanical systems (MEMS).

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
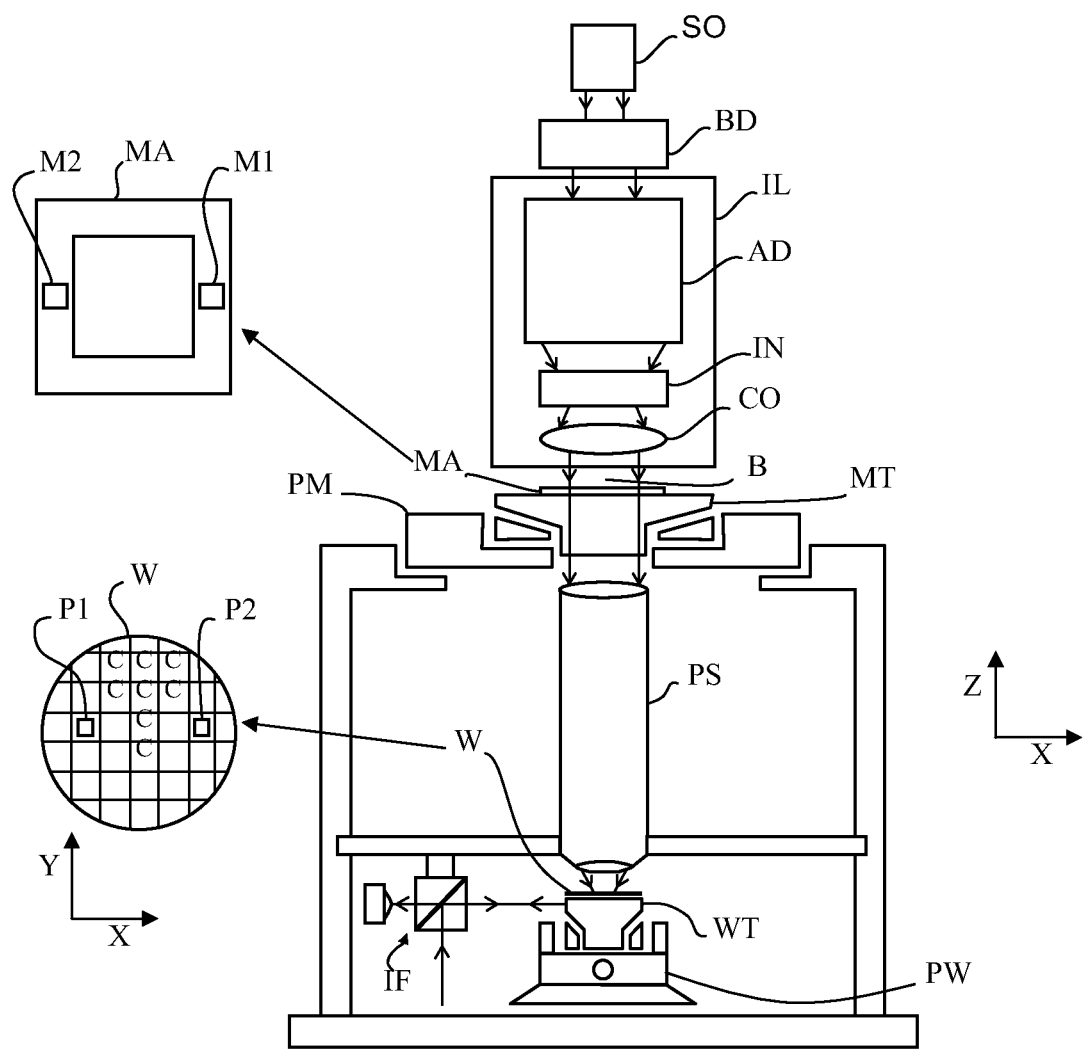
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The mask support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the mask support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:
1. In step mode, the mask table MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.
2. In scan mode, the mask table MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the mask table MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.
3. In another mode, the mask table MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed. The invention relates to, among other things, a lithographic apparatus that has a support. The support is provided with burls for holding an object. The support, or part thereof, has been fabricated with a lithographic manufacturing method, e.g., a MEMS-technology, so as to create burls whose orientations or positions are individually electrically controllable.

A support for holding an object such as a mask or a substrate in a lithographic apparatus may be produced with a lithographic manufacturing method. The method may comprise depositing a radiation sensitive layer on a first side of the support and projecting a beam of radiation onto the radiation sensitive layer on the first side of the support. This may, for example be done after an electric conductive material is deposited on the first side of the support. Subsequently, the resist may be developed and the (positive) resist exposed to the radiation may be washed away by the developer. In a next step the electric conductive layer which is not covered by the developed resist may be etched away. In this way an electric conductive pattern may be provided on the first side of the support. Dependent on the pattern the beam has provided to the resist the electrical conductive layer may have different functions.

Figure 2:
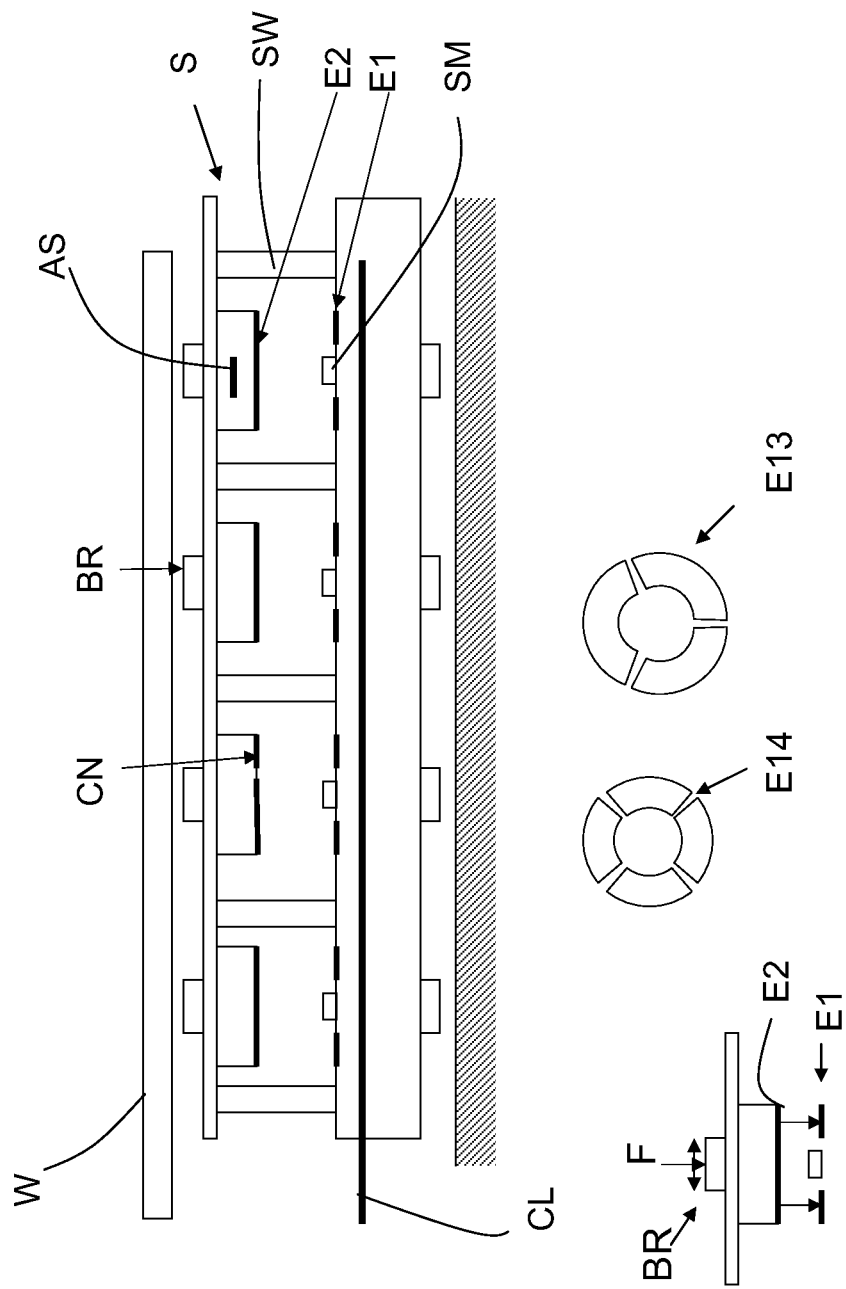
FIG. 2 depicts a support according to an embodiment for use in the lithographic apparatus of FIG. 1; and, FIG. 3 depicts a support according to a further embodiment for use in the lithographic apparatus of FIG. 1.

For example, the pattern may be used to provide an electrode E1 to the support S (see FIG. 2). The electrode E1 may cooperate with another electrode E2. Between the electrodes a capacitive force may be provided by charging the electrodes E1, E2. The force may be used to deform the support S so as to hold the object W on top of the burls BR with an improved flatness. The electrode E2 may be provided in a flexible plate close to the burls BR to provide a good control of the burl BR. The support S may be provided with a support wall SW to create a space between the electrodes E1, E2, so that the electrodes may move with respect to each other. The electrode E2 near the burl BR may be passive while the electrode E1 may be charged via wire CL or a wireless link. The electrode E1 may comprises three (see E13) or four (see E14) portions so as to control a force F on the burl BR in three degrees of freedom. Sensors such as for example capacitive sensor CN and/or acceleration sensor AS may be used to control the force F on the burl BR. The pattern may be used to provide a controller connected to at least one of the electrodes E1, E2 and one of the acceleration sensor AS or capacitive sensors CN in the support S to control the electrostatic force in a feedback loop to a particular set point value. A stop SM may be used to limit the movements of the burls BR to a max.

Figure 3:
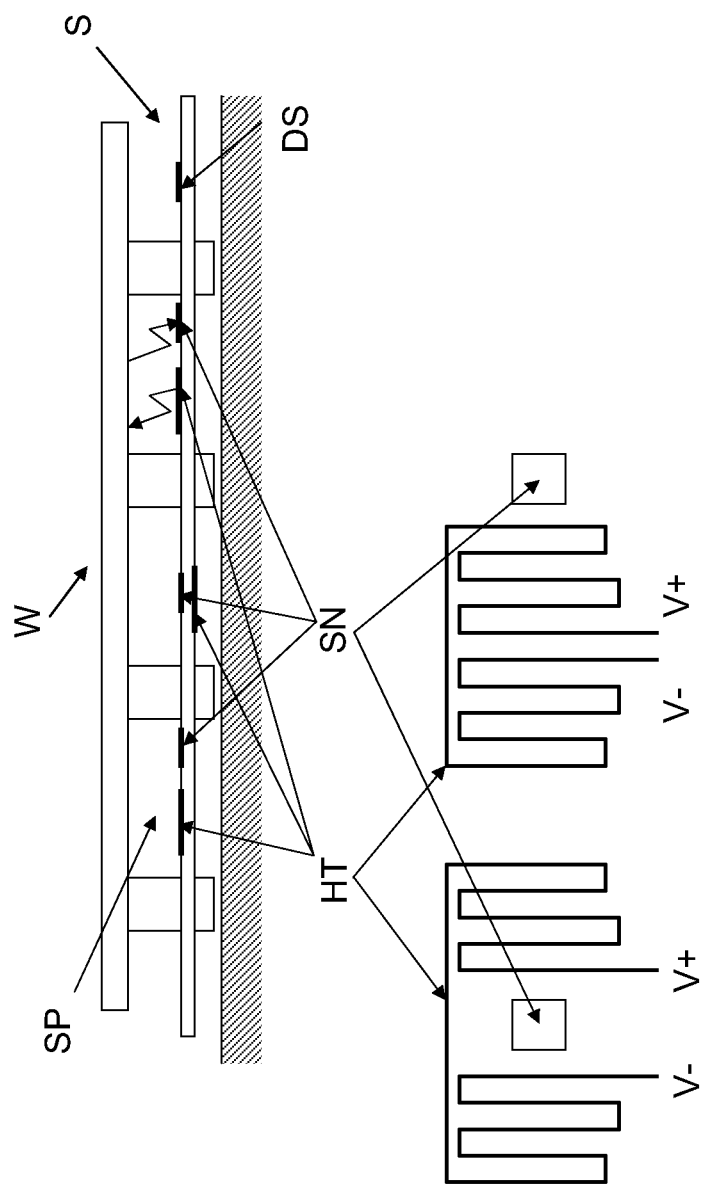

The pattern may be used to provide a heater HT (see FIG. 3) to the support S and/or to provide a current to the heater HT. The heater HT may be used (locally) to heat the support S and/or the object W. Heating may be used to counteract a surplus of cooling or to adjust the shape of the support S and/or the object W by thermal expansion. The pattern may be used to provide a sensor SN to the support S for example, a temperature sensor SN may be provided to the support S to measure the temperature of the support S and/or the object W. The sensor SN may be provided adjacent the heater HT or on top of the heater HT such that both are provided on a different side of the support S. The heater HT may be an infra red radiator to heat the object W and the sensor SN may be an IR sensor to measure the objects temperature. Alternatively, the sensor DS may be a dose sensor for measuring the exposure radiation e.g. 193 nm or EUV radiation. The pattern may be used to provide a controller connected to the heater HT and the temperature sensor SN in the support S to control the temperature in a feedback loop to a particular set point value. The space SP between the support S and the object W may be provided with a gas e.g. hydrogen or argon to enhance the heat transfer between the heater HT and the object W.

A support manufactured by the lithographic method may have an electrostatic clamp provided to the support. The electrostatic clamp may be controlled in such a way that the clamping force may be adjusted to adjust the shape of the object such as the substrate, mask or mirror. The support may therefore be provided with burls that are flexible and allow for positional adjustment of the object by adjusting the clamping force.

A support manufactured by the lithographic method may be used to correct for field curvature. By adjusting the shape of the object, the influence of field curvature may be minimized. For this purpose the clamping force may be adjusted and/or the burls may be adjusted so as to adjust the shape of the object.

A support manufactured by the lithographic method may be provided with piezo's and the piezo's may be used to adjust the shape of the burls.

The burls BR on the support for holding an object such as a mask or a substrate in a lithographic apparatus may be also be produced with a lithographic manufacturing method. The method may comprise depositing a radiation sensitive layer on a first side and projecting a beam of radiation onto the radiation sensitive layer on the first side of the support. Subsequently, the resist may be developed and the (positive) resist exposed to the radiation may be washed away by the developer. In a next step a portion of the support which is not covered by the developed resist may be etched partially away to form a burl BR. The method may also be used to provide small trenches on top of the burls BR so as to decrease sticking between the support and the object. The burls may also be irradiated without providing a resist on top of the burl to make the burls rough.

The support may be coated with a wear resistant layer e.g. chromium nitride, titanium nitride, boron nitride, silicium carbide, diamond like carbon or SiSiC.

The support may be turned around and a radiation sensitive layer may be deposited on a second side of the support. The beam of radiation may expose the radiation sensitive layer on the second side of the support.

In an embodiment there is provided a lithographic apparatus comprising a support for holding an object, and an object handler for handling the object, wherein the support is handleable by the object handler. The support may have any of the features mentioned above. This has the advantage that it is possible to easily exchange the support from the lithographic apparatus. During use, the support may get worn or contaminated. When a certain amount of wear or contamination is reached, it may be needed to exchange the support to maintain a proper support for the object. By exchanging the support using the object handler, this can be done quickly, as there is no need for an operator to open the apparatus and remove the support manually. This results in less down-time of an apparatus.

The object handler may be arranged to load the object and the support into the lithographic apparatus, or unload the object and support from the lithographic apparatus, or both. A lithographic apparatus may be provided with multiple object handlers, for example one for loading the object and one for unloading the object. This may reduce the time needed to load and unload substrates. Providing only a single object handler for both loading and unloading may result in a lower cost for the apparatus.

The support may have substantially the same size as a substrate. This has the advantage that substantially no alteration of the object handler is needed for it to handle the support. From a handing point of view, there is no difference between the support and the object. Further, it may have the advantage that a regular substrate may be used as a starting material to create the support.

The object may be a substrate, wherein the support is connected to a substrate positioner PW for positioning the substrate during an exposure of the substrate. The support may be part of the substrate stage comprising the substrate positioner PW, that accurately moves the substrate relative to the projection system, such that a pattern can be accurately projected onto the substrate. When the support is exchanged, part of the wafer stage remains in the apparatus, for example the part with motors and/or sensors.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate", "target portion" or "mirror", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising a support for holding an object, wherein:
   the support has a first part with a first upper main surface facing the object when the support is holding the object;
   the support has a second part with a second upper main surface facing a first bottom main surface of the first part;
   the second upper main surface and the first bottom main surface are spaced apart from each other by means of multiple discrete support walls;
   the support has a plurality of burls extending from the first upper main surface;

a first one of the plurality of burls has a first top surface operative to contact the object when the support is holding the object;

a second one of the plurality of burls has a second top surface operative to contact the object when the support is holding the object;

the first top surface has a first position relative to the second upper main surface and has a first orientation relative to the second main surface;

the second top surface has a second position relative to the second upper main surface and has a second orientation relative to the second upper main surface;

the lithographic apparatus comprises a controller that is configured to perform at least one of:
  control the first position and the second position independently of one another when the support is holding the object; and
  control the first orientation and the second orientation independently of one another when the support is holding the object.

2. The lithographic apparatus of claim 1, wherein:
the first lower main surface accommodates a first electrode underneath the first burl;
the second upper main surface accommodates a second electrode facing the first electrode;
the controller is operative to control at least one of the first position and the first orientation via controlling a capacitive force between the first electrode and the second electrode.

3. The lithographic apparatus of claim 2, wherein:
the second electrode comprises multiple electrically isolated portions; and
the controller is operative to control at least one of the first position and the first orientation via controlling a respective component of the capacitive force between a respective one of the multiple electrically isolated portions and the first electrode.

4. The lithographic apparatus of claim 1, wherein:
the first part accommodates a sensor configured to sense at least one of a first change in the first position and a second change in the first orientation and to provide a sensor output signal representative of at least one of the first change and the second change; and
the controller is operative to control at least one of the first position and the first orientation in dependence on the sensor output signal.

5. The lithographic apparatus of claim 1, wherein:
the second upper main surface accommodates a stop configured to limit at least one of a first change in the first position and a second change in the second position.

6. The lithographic apparatus of claim 1, wherein:
the first upper main surface accommodates at least one of:
  a heater operative to locally generate heat;
  a temperature sensor operative to sense a local temperature of at least one of the support and the object.

7. The lithographic apparatus of claim 1, wherein the support is implemented in a microelectromechanical systems (MEMS) technology.

8. The lithographic apparatus of claim 2, wherein:
the first part accommodates a sensor configured to sense at least one of a first change in the first position and a second change in the first orientation and to provide a sensor output signal representative of at least one of the first change and the second change; and
the controller is operative to control at least one of the first position and the first orientation in dependence on the sensor output signal.

9. The lithographic apparatus of claim 3, wherein:
the first part accommodates a sensor configured to sense at least one of a first change in the first position and a second change in the first orientation and to provide a sensor output signal representative of at least one of the first change and the second change; and
the controller is operative to control at least one of the first position and the first orientation in dependence on the sensor output signal.

10. The lithographic apparatus of claim 2, wherein:
the second upper main surface accommodates a stop configured to limit at least one of a first change in the first position and a second change in the second position.

11. The lithographic apparatus of claim 2, wherein:
the first upper main surface accommodates at least one of:
  a heater operative to locally generate heat;
  a temperature sensor operative to sense a local temperature of at least one of the support and the object.

12. The lithographic apparatus of claim 3, wherein:
the first upper main surface accommodates at least one of:
  a heater operative to locally generate heat;
  a temperature sensor operative to sense a local temperature of at least one of the support and the object.

13. The lithographic apparatus of claim 5, wherein:
the first upper main surface accommodates at least one of:
  a heater operative to locally generate heat;
  a temperature sensor operative to sense a local temperature of at least one of the support and the object.

* * * * *